(12) United States Patent
Kataho et al.

(10) Patent No.: US 8,158,209 B2
(45) Date of Patent: Apr. 17, 2012

(54) METHOD AND APPARATUS FOR COATING RESIN

(75) Inventors: Hideaki Kataho, Kanagawa (JP); Hiroshi Okada, Kanagawa (JP); Kenya Wada, Tokyo (JP); Hisayoshi Ichikawa, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 12/640,676

(22) Filed: Dec. 17, 2009

(65) Prior Publication Data

US 2010/0092684 A1 Apr. 15, 2010

Related U.S. Application Data

(62) Division of application No. 11/752,337, filed on May 23, 2007, now abandoned.

(30) Foreign Application Priority Data

May 26, 2006 (JP) .................................. 2006-146179

(51) Int. Cl.
*B05D 1/02* (2006.01)
(52) U.S. Cl. .................. 427/421.1; 427/425; 427/427.1; 427/427.3; 118/300; 118/305; 118/313; 118/318; 438/637; 438/778

(58) Field of Classification Search ............... 427/421.1, 427/425, 427.1, 427.3; 118/300, 305, 313, 118/318; 438/637, 778
See application file for complete search history.

(56) References Cited

U.S. PATENT DOCUMENTS

| | | | |
|---|---|---|---|
| 3,683,396 A | 8/1972 | Keur et al. | |
| 5,534,307 A * | 7/1996 | Hikita et al. | 427/346 |
| 6,213,591 B1 | 4/2001 | Suetsugu et al. | |
| 6,518,056 B2 | 2/2003 | Schembri et al. | |
| 2004/0017424 A1 * | 1/2004 | Koguchi | 347/40 |
| 2004/0238008 A1 | 12/2004 | Savas et al. | |
| 2004/0252174 A1 | 12/2004 | Baxter et al. | |
| 2005/0101694 A1 * | 5/2005 | Elmer et al. | 523/160 |
| 2005/0116340 A1 * | 6/2005 | Shindo | 257/737 |
| 2006/0231018 A1 * | 10/2006 | Kijima | 118/52 |

* cited by examiner

*Primary Examiner* — Frederick Parker
*Assistant Examiner* — Xiao Zhao
(74) *Attorney, Agent, or Firm* — Antonelli, Terry, Stout & Kraus, LLP

(57) ABSTRACT

Method and apparatus for coating a surface of a work with a thin resin or plastic film suitable for use in imprinting a pattern by impressing a master pattern on a transfer surface of a mold on the coated resin film. A curable resin liquid is coated on a work by the use of an inkjet feed means having a plural number of inkjet nozzle holes in a row or rows on a nozzle assembly, in association with actuators to propel droplets of resin liquid from the respective inkjet nozzle holes in controlled timings while moving the inkjet feed means and the work relative to each other.

8 Claims, 5 Drawing Sheets

METHOD AND APPARATUS FOR COATING RESIN

This application is a Divisional application of application Ser. No. 11/752,337, filed May 23, 2007, now abandoned, the contents of which are incorporated herein by reference in their entirety.

BACKGROUND OF THE INVENTION

1. Field of the Art

This invention relates to method and apparatus for coating a resin, and more particularly to method and apparatus for coating a surface of a substrate plate with a thin film of a curable resin or plastic suitable for use in imprinting a pattern of infinitesimally minute dents and projections.

2. Prior Art

In the so-called nano-imprinting, a rectilinear or circular pattern of infinitesimally minute dents and projections is transferred to a surface of a substrate plate of an arbitrary shape by a hot embossing, molding or stamping process. In any case, a curable resin film is coated on a surface of a substrate plate in a preparatory stage. In the case of a stamping process, a photo-setting synthetic resin is coated on a substrate plate, followed by impression of a mold against the coated resin film to transfer a pattern of minute dents and projections to the coated plastic film from a transfer surface of the mold. While the mold is in an impressed state, the resin film is irradiated with light rays for setting the resin. The substrate plate which comes out upon separation from the mold has a pattern of minute dents and projections transferred on its surface.

With a substrate plate of a circular or annular shape, it has been the general practice to coat the substrate plate with a resist film by the use of a high speed spin machine as described in Japanese Laid-Open Patent Application H6-333807, for example. Namely, in this case, a work in the form of a circular glass plate is put on a turn table, and, while the turn table is rotated at high speed, a resist liquid is dripped on a work surface from a resist liquid feed nozzle which is moved radially from the center to the outer periphery of the turn table. Since the work is rotated along with the turn table, the resist liquid is fed onto the work surface in a spiral shape and urged to flow in radially outward directions under the influence of centrifugal force to form a resist film over the entire surface of the work.

As described above, a resist liquid is applied by high speed spin coating in Japanese Laid-Open Patent Application H6-333807. In the case of the high speed spin coating, a resist liquid is spread with the aid of centrifugal force. In that case, however, there is a difference in circumferential speed between inner and outer peripheral areas, so that the resist liquid is subjected to greater centrifugal force in outer peripheral portions than in inner peripheral portions, and as a result a coated resist film has different thicknesses in inner and outer peripheral portions of the substrate plate. Besides, in the case of the high speed spin coating as in Japanese Laid-Open Patent Application H6-333807 mentioned above, there is a limit to reduction of film thickness. That is to say, the method of Japanese Laid-Open Patent Application H6-333807 can be suitably applied to a process for coating a resist film on a master of an optical disc, but cannot be applied to a process for coating an extremely thin resin film uniformly on a work surface.

For example, to cope with the trends toward larger storage capacities and higher densities of semiconductor integrated circuits, magnetic discs and optical discs, there have been developed and put in use nano-structure devices having a pattern of infinitesimally minute dents and projections on a surface of a substrate plate. As described in Japanese Laid-Open Patent Application H6-333807 mentioned above, the hot embossing technology which is generally applied in the production of an optical disc master has a limit in the size of minute dents and projections to be formed on a substrate plate. Beside the hot embossing, neither the molding process nor the stamping process cannot be applied to nano-imprinting in case of a pattern involving dents and projections smaller than several tens nanometers. This is because, in the case of nano-imprinting, it is required to coat an extremely thin resin film uniformly on a surface of a substrate plate and with extremely high accuracy. At least from the standpoint of mass production, the high sped spin coating is unsuitable for application to a process for manufacturing resin-coated substrate plates which are strictly controlled in thickness of resin film.

SUMMARY OF THE INVENTION

In view of the above-discussed problem, it is an object of the present invention to make it possible to coat a surface of a substrate plate efficiently uniformly with an extremely thin resin film, which is particularly suitable for use in imprinting a nano-pattern by impressing a master pattern on a transfer surface of a mold against the resin film.

In accordance with the present invention, in order to achieve the above-stated objective, there is provided a resin coating apparatus for coating a surface of a substrate plate with a thin resin film suitable for use in imprinting a pattern by impressing thereon a master pattern on a transfer surface of a mold, characterized in that said apparatus comprises: an inkjet feed means having a plural number of inkjet nozzle holes in an array on a nozzle assembly to feed droplets of a resin liquid onto a surface of the substrate plate, each one of said inkjet nozzle holes being associated with an actuator to propel a droplet of said resin liquid intermittently in a controlled timing; and a linear or rotational drive means adapted to move said inkjet feed means and the substrate plate relatively at least in a direction perpendicular to the array of the inkjet nozzle holes or in a rotational direction.

In this instance, the substrate plate is not limited to a particular shape. For example, it may be in a circular shape like semiconductor wafers and optical parts, may be in an annular shape like magnetic or optical discs, or may be in square or other arbitrary shapes. The resin to be coated on a substrate plate is a curable resin which can be set by irradiation of light rays including ultraviolet rays or by heating or cooling.

The inkjet feed means has a plural number of inkjet nozzle holes arrayed in a predetermined direction on a nozzle assembly, in association with actuators like piezoelectric elements thereby propelling droplets of a resin liquid out of the respective inkjet nozzle holes intermittently in controlled timings for deposition on the substrate plate surface. At least one of the inkjet feed means or the substrate plate is moved relative to the other one by means of a linear or rotational drive means. In case of a linear drive, it is adapted to move either the inkjet feed means or a substrate plate in a direction perpendicular to the array of the inkjet nozzle holes on the nozzle assembly. In case of a rotational drive, the inkjet nozzle holes are arrayed in a row or rows in a radial direction of a substrate plate. Pico-order droplets are propelled from the respective inkjet nozzle holes. The thickness of the resin film can be controlled by way of the size of droplets of resin liquid and the number of droplets to be fed per unit area of a substrate plate.

In a case where a resin liquid is fed onto a surface of an annular substrate plate, the inkjet resin feed means has inkjet nozzle holes arrayed in a row or rows on a nozzle assembly, which is long enough for covering at least the diameter or radius of the substrate plate. In this case, either the inkjet nozzle assembly or the substrate plate is put in rotation by the drive means. In a case where the substrate plate is put in rotation, the rotational speed should be controlled to a low level at which droplets of resin liquid can be deposited free of influences of centrifugal force. The inkjet nozzle holes which are arrayed in the radial direction of the substrate plate are so controlled that droplets of resin liquid are fed at longer time intervals in the inner peripheral side of the substrate plate than in the outer peripheral side. Namely, in consideration of differences in circumferential length, the timing of drop feed is shortened from the inner to outer periphery of the substrate plate. Thus, droplets of resin liquid are deposited and coated uniformly on the entire surface of a substrate plate from the inner to outer periphery.

Further, according to the present invention, there is also provided a method for coating a surface of a work with a thin resin film suitable for use in imprinting a pattern by impressing thereon a master pattern on a transfer surface of a mold, characterized in that the method comprises the steps of: providing an inkjet feed means having a plural number of inkjet nozzle holes in a nozzle assembly; positioning the nozzle assembly face to face with a coating surface of the work; and propelling droplets of a resin liquid toward the work from the respective inkjet nozzle holes while moving the work relative to the inkjet feed means or vice versa.

The above and other objects, features and advantages of the present invention will become apparent from the following particular description of the invention, taken in conjunction with the accompanying drawings which show by way of example preferred embodiments of the invention. Needless to say, the present invention should not be construed as being limited to particular forms shown in the drawings.

DESCRIPTION OF PREFERRED EMBODIMENTS

Figure 1:
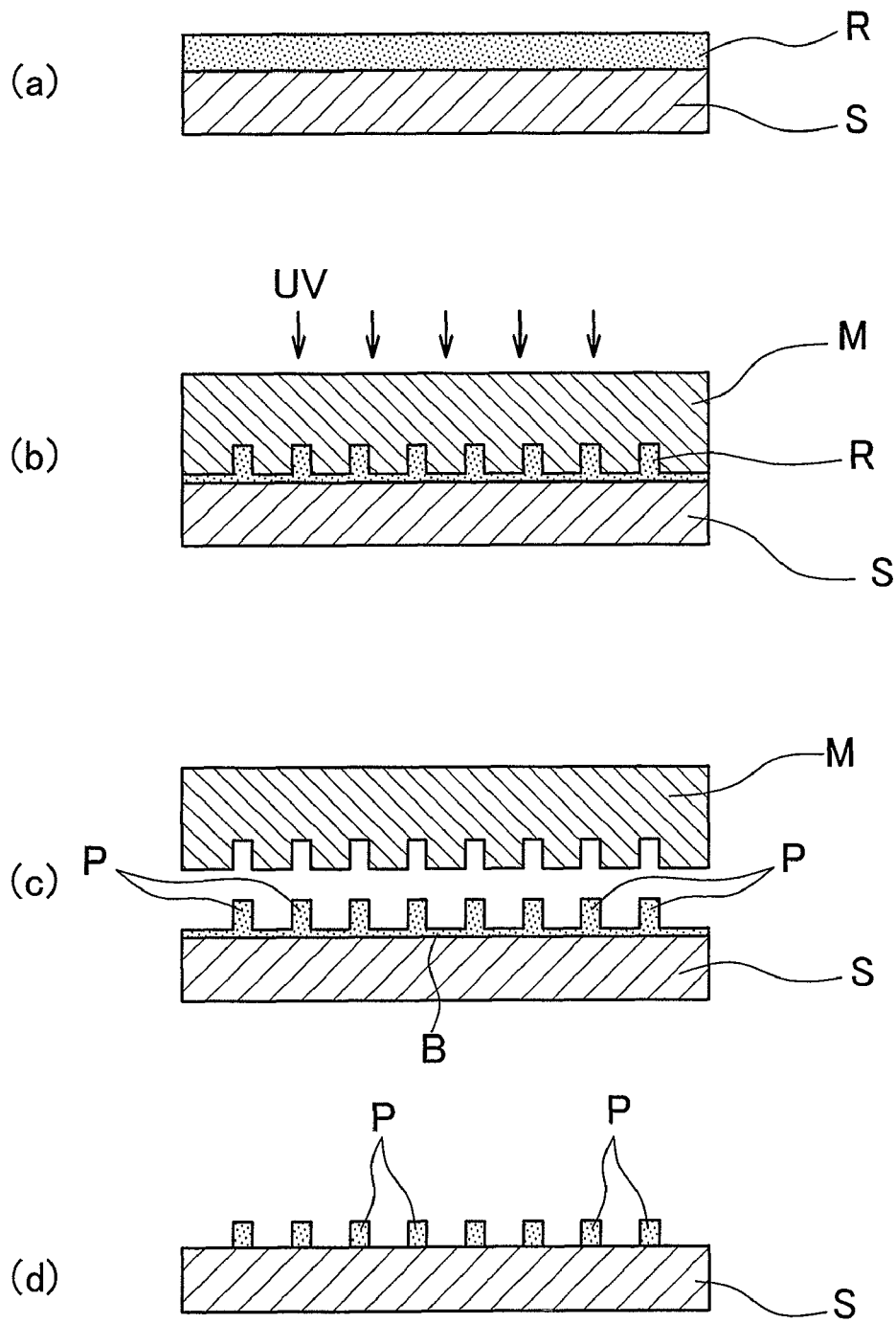
FIG. 1 is a schematic illustration explanatory of steps of a nano-imprinting process.

Hereafter, with reference to the accompanying drawings, the present invention is described more particularly by way of its preferred embodiments. Reference is first had to FIG. 1 which schematically shows steps of a nano-imprinting process for imprinting a photo-setting resin or plastic. As shown at (a) of that figure, an ultraviolet-setting resin R is coated on a surface of a glass substrate plate S of the sort which is generally used for a data recording medium. In this instance, the resin R is in the form of a liquid, and, as shown in FIG. 1(b), a master pattern of dents and projections on a transfer surface of a mold M is transferred to the resin R by impressing the mold M under pressure. While the mold M is in a pressed state, the resin R is cured by irradiation of ultraviolet rays UV. Thereafter, upon separating the mold M as shown in FIG. 1(c), there comes out a substrate plate S which has minute projections P transferred and imprinted on its surface. In this state, however, a base layer B still remains on the substrate surface. Therefore, the substrate plate S is immersed in a predetermined solution to remove the base layer B as shown in FIG. 1(d).

Figure 2:
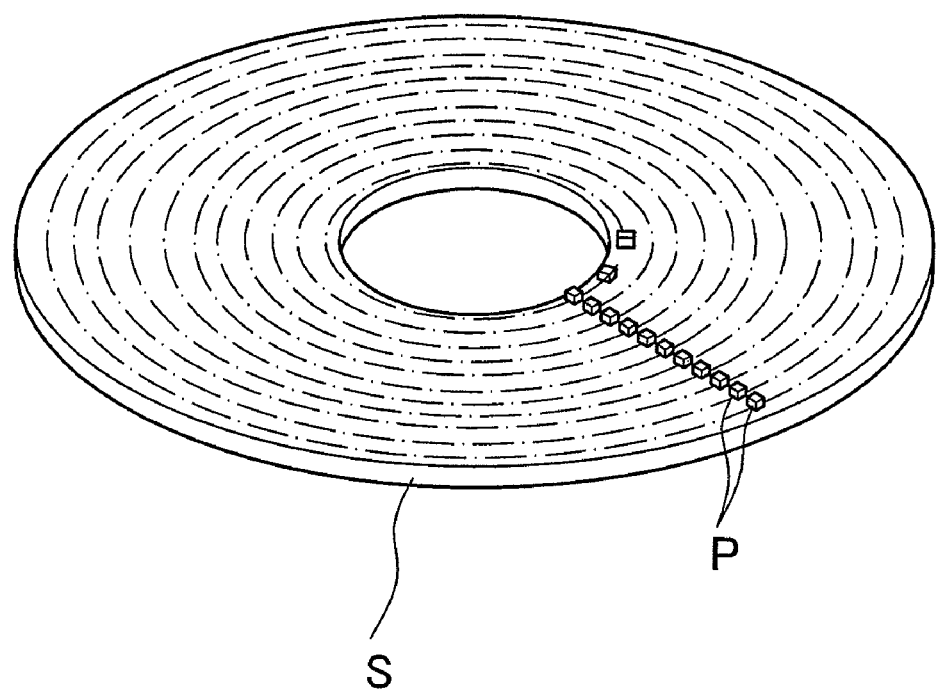
FIG. 2 is a schematic view of a pattern of nano-order dents and projections imprinted on a surface of a substrate plate.

In a nano-imprinting process as described above, it is an imperative requisite for the resin R to be coated in uniform thickness. If a coated resin film has variations in thickness, it becomes difficult to transfer minute dents and projections of nano order accurately by impression of a mold M. Besides, in consideration of the necessity of exfoliation of a base layer B, a resin M should not be coated in a redundantly large thickness. Through the steps shown in FIG. 1, a multitude of minute projections in a concentric pattern are formed on the surface of the substrate plate S as shown in FIG. 2. In this instance, for use as a data recording medium, the respective projections P should be infinitesimally minute in dimensions and yet should be uniform in shape. For instance, in order to imprint projections P which are 100 nm in height and 30 nm in diameter and spaced from each other by an interval of 100 nm, along with a base layer of a thickness of 5 nm±2 nm, the resin R should be coated on a substrate plate S in a thickness of approximately 100 nm to 120 nm.

Figure 3:
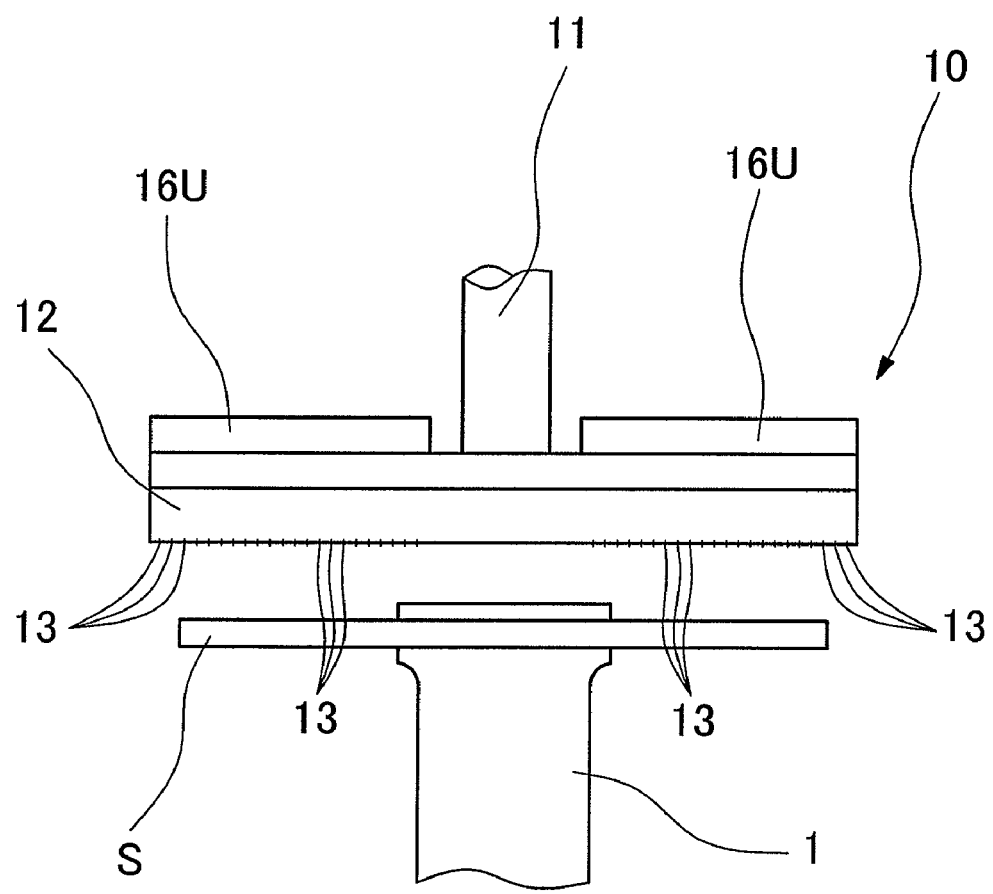
FIG. 3 is a schematic front view of a resin coating apparatus.
Figure 4:
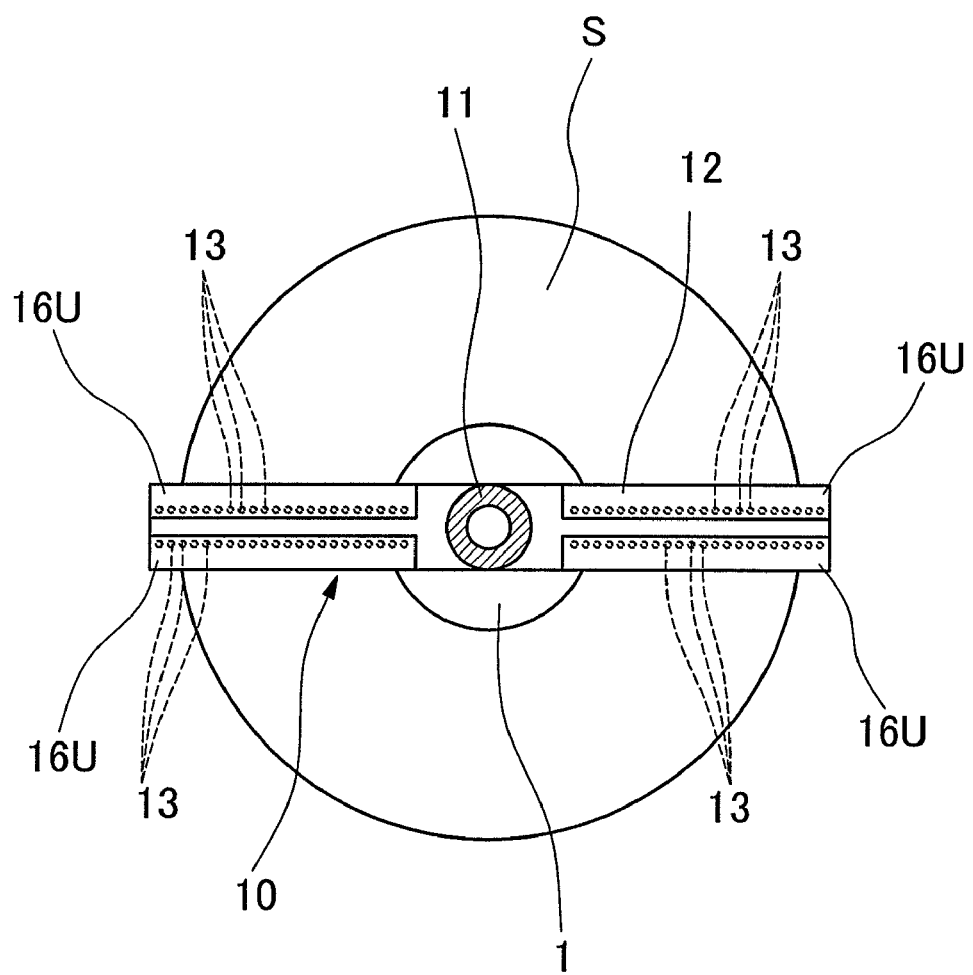
FIG. 4 is a schematic plan view of the resin coating apparatus shown in FIG. 3.

In order to coat a resin R in the form of such an extremely thin film, a resin liquid is fed onto the surface of a substrate plate S by drop-feeding, using an inkjet resin feed means as shown in FIGS. 3 and 4. As shown in these figures, a substrate plate S is rotatably set on a spindle 1, face to face with an inkjet resin feed means 10. The inkjet resin feed means 10 is provided with a bar-like manifold nozzle assembly 12 at the lower end of a vertical pendant shaft 11. A multitude of nozzle holes are bored in the nozzle assembly 12 at very small intervals in the longitudinal direction of the nozzle assembly 12. The pendant shaft 11 is located vertically in alignment with the center of rotation of the spindle 1, and arranged to support the bar-like nozzle assembly 12 in a horizontal position in such a way as to fully cover the whole diameter of the substrate plate S on the spindle 1. In the case of the particular inkjet resin feed means 10 shown in the drawing, the nozzle holes 13 are bored in two rows in the longitudinal direction of the nozzle assembly 12. The pendant shaft 11 of the inkjet means 10 is at least movable up and down in the vertical direction. If necessary, arrangements may be made to move the inkjet resin feed means 10 in a direction perpendicular to the vertical pendant shaft 11.

Figure 5:
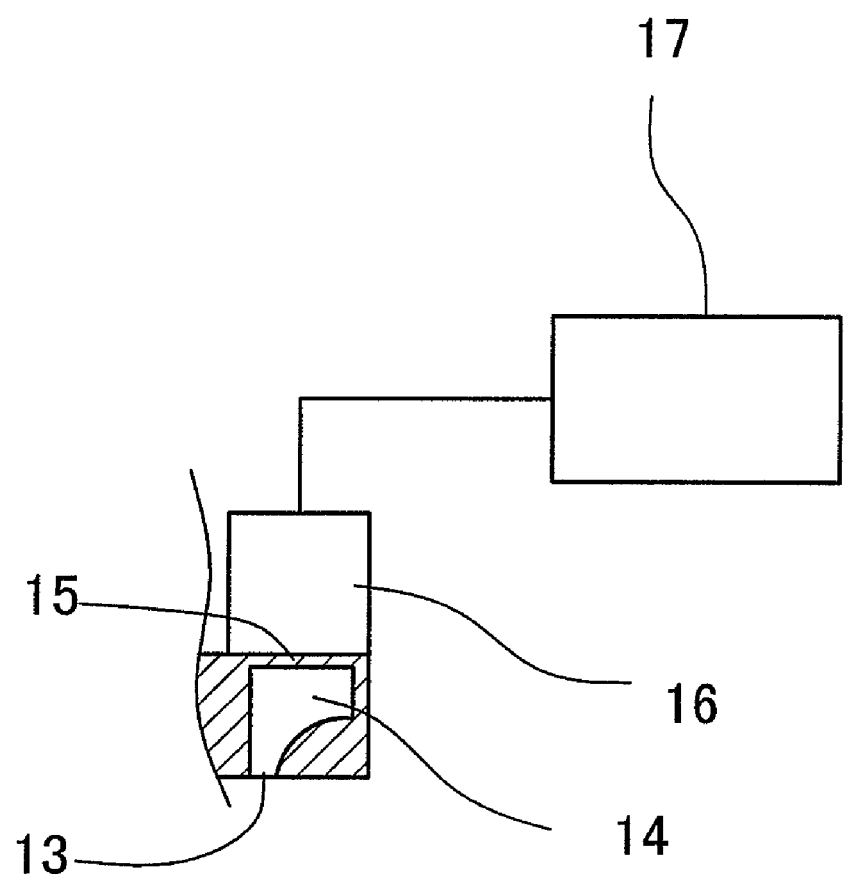
FIG. 5 is a schematic sectional view showing construction of an inkjet nozzle on an inkjet means.

As shown in FIG. 5, the respective nozzle holes 13 on the nozzle assembly 12 are communicated with a resin liquid supply passage 14, which in turn is connected to a resin liquid reservoir tank (not shown) through the pendant shaft 11. On the side away from the side in which the inkjet nozzle holes 13 are opened, the nozzle assembly 12 is provided with a flexible membrane 15 in association with piezoelectric elements 16 (indicated in FIGS. 3 and 4 as piezoelectric assembly units 16U mounted in association with the inkjet nozzle holes 13 on the opposite sides of the pendant shaft 11) which function as actuators for controlling the resin liquid drop-feed rate from the respective inkjet nozzles 13. Thus, each time a piezoelectric element 16 of an inkjet nozzle hole 13 is driven, the flexible membrane 15 are pushed to apply a pressure to a resin liquid in the resin liquid supply passage 14, propelling a droplet of resin liquid out of that inkjet nozzle hole 13. In this manner, the drop feed of resin liquid from the respective nozzle holes 13 can be controlled separately and independently of each other. For this purpose, the inkjet resin feed means 10 is provided with a control circuit 17 thereby to drive the respective piezoelectric elements 16 in controlled timings.

In this instance, each time, a droplet of resin liquid of several to ten and several picoliters is propelled out of each inkjet nozzle hole 13 toward the surface of the substrate plate S. In order to prevent droplets of resin liquid from splashing off the surface of the substrate plate S, the resin liquid is supplied from the nozzle assembly 12 which is located in small gap relation with the substrate plate S, more specifically, at a space of 1 to 3 mm from the surface of the substrate plate S, while controlling the voltage to be applied to the respective piezoelectric elements 16.

By the use of the inkjet resin feed means 10 as described above, an extremely thin resin film is coated uniformly on the entire surface of a substrate plate S. More specifically, a substrate plate S is set on the spindle 1, and the inkjet resin feed means 10 is positioned face to face with the substrate plate S. While the substrate plate S is put in rotation by the spindle 1, droplets of resin liquid are propelled out of the respective nozzle holes 13 on the nozzle assembly 12 and deposited on the surface of the substrate plate S. At this time, a droplet of resin liquid is fed at longer time intervals from inkjet nozzle holes 13 facing inner peripheral portions of the substrate plate S, that is to say, droplets of resin liquid are fed from the inkjet nozzle holes 13 at shorter time intervals in outer peripheral portions of the substrate plate S where a drop feed circumferential length becomes greater. That is to say, a droplet of resin liquid is propelled at the shortest time intervals from inkjet nozzle holes 13 radially in the outermost position. The inkjet nozzle holes 13 are driven separately and independently by piezoelectric elements 16 which are provided in the respective inkjet nozzle hole 13. Drop feed timings of the respective inkjet nozzle holes 13 are controlled and varied by the afore-mentioned control circuit 17, shortening the drop feed time intervals from the inner to outer periphery of the substrate plate S as mentioned above.

Thus, as described above, a thin film of a resin R, approximately 100 nm in thickness, can be coated uniformly over the entire surface of a substrate plate S by feeding droplets of resin liquid by the use of the inkjet feed means 10. Accurate nano-imprinting is feasible simply by impressing a master pattern on a transfer surface of a mold against the coated resin R.

What is claimed is:

1. A method for coating an entire surface of a work having a circular shape, with a thin and uniform photo-setting synthetic resin film suitable for use in a nano-imprinting apparatus for imprinting a pattern by impressing thereon a master pattern on a transfer surface of a mold, characterized in that said method comprises the steps of:

providing an inkjet feed means having a horizontally arranged bar-shaped manifold nozzle assembly at a pendant shaft positioned vertically in alignment with a center rotation line of a spindle having the work set thereon, said nozzle assembly being arranged in such a way as to cover the entire surface of said work;

feeding droplets of resin liquid for forming the resin film, from a plurality of inkjet nozzle holes of said nozzle assembly through a resin liquid supply passage provided in a center line of the vertical pendant shaft, onto said surface of said work during rotation of said work, so as to coat the thin and uniform photo-setting synthetic resin film on the entire surface of the work; and controlling drop feed timings from said inkjet nozzle holes in such a way that droplets of said resin liquid are fed onto said work at a shorter time interval in an outer peripheral side than in an inner peripheral side of said work, wherein a thin and uniform photo-setting synthetic resin film, used in a nano-imprinting apparatus for imprinting a pattern by impressing thereon a master pattern on a transfer surface of a mold, is provided.

2. A method for coating the entire surface of a work as set forth in claim 1, wherein said nozzle assembly has a length to cover from a center of said work to an outer periphery of said work.

3. A method for coating the entire surface of a work as set forth in claim 1, wherein said nozzle assembly has a length to cover a diameter of said work.

4. A method for coating the entire surface of a work as set forth in claim 1, wherein said nozzle assembly is located vertically apart from said work.

5. A method for coating the entire surface of a work as set forth in claim 1, wherein said nozzle assembly is driven vertically in an up and down direction.

6. A method for coating the entire surface of a work as set forth in claim 1, wherein a gap of 1 to 3 mm is formed between said nozzle assembly and said work.

7. A method for coating the entire surface of a work as set forth in claim 1, wherein said drop feed timings from individual inkjet nozzle holes are independently and separately controlled.

8. A method for coating the entire surface of a work as set forth in claim 1, wherein said thin and uniform photo-setting synthetic resin film coated on the entire surface of the work has a thickness of approximately 100 nm to 120 nm.

* * * * *